(12) United States Patent
Willems

(10) Patent No.: US 7,057,473 B1
(45) Date of Patent: Jun. 6, 2006

(54) ELECTROMAGNETIC BROADSIDE ENERGY PROBE WITH INTEGRAL IMPEDANCE MATCHING

(75) Inventor: David A. Willems, Leo, IN (US)

(73) Assignee: ITT Manufacturing Enterprises Inc., Wilmington, DE (US)

( * ) Notice: Subject to any disclaimer, the term of this patent is extended or adjusted under 35 U.S.C. 154(b) by 0 days.

(21) Appl. No.: 11/223,157

(22) Filed: Sep. 9, 2005

Related U.S. Application Data

(62) Division of application No. 10/320,986, filed on Dec. 17, 2002, now Pat. No. 6,956,448.

(51) Int. Cl.
*H01P 5/18* (2006.01)
*G01R 27/04* (2006.01)

(52) U.S. Cl. ............... 333/116; 333/33; 324/149
(58) Field of Classification Search ........... 333/116, 333/24 R, 246, 33; 324/149
See application file for complete search history.

(56) References Cited

U.S. PATENT DOCUMENTS

| | | | |
|---|---|---|---|
| 3,593,207 A | 7/1971 | Woermbke et al. | |
| 4,013,981 A | 3/1977 | Shintani et al. | |
| 4,189,691 A | 2/1980 | McDonough | |
| 4,525,689 A | 6/1985 | Wagner et al. | |
| 4,644,260 A | 2/1987 | Warder | |
| 4,697,143 A | 9/1987 | Lockwood et al. | |
| 4,795,989 A | 1/1989 | Hart et al. | |
| 5,231,349 A | 7/1993 | Majidi-Ahy et al. | |
| 5,457,399 A | 10/1995 | Krumm | |
| 5,488,313 A | 1/1996 | Gourse et al. | |
| 5,585,330 A | 12/1996 | Cadotte et al. | |
| 5,625,328 A | 4/1997 | Coleman, Jr. | |
| 5,821,410 A | 10/1998 | Xiang et al. | |
| 5,821,758 A | 10/1998 | Jindal | |
| 5,854,559 A | 12/1998 | Miranda et al. | |
| 5,959,460 A | 9/1999 | Johnson | |
| 6,049,219 A | 4/2000 | Hwang et al. | |
| 6,172,497 B1 | 1/2001 | Okumichi | |
| 6,229,327 B1 | 5/2001 | Boll et al. | |
| 6,281,690 B1 | 8/2001 | Frey | |
| 6,288,677 B1 | 9/2001 | Fink | |
| 6,483,398 B1 | 11/2002 | Nagamori et al. | |
| 6,753,676 B1 * | 6/2004 | Myer ................... | 324/95 |
| 2001/0017549 A1 | 8/2001 | Inoue et al. | |
| 2001/0035800 A1 | 11/2001 | Miller | |
| 2002/0011855 A1 | 1/2002 | Heal et al. | |
| 2002/0011856 A1 | 1/2002 | Huang et al. | |

* cited by examiner

*Primary Examiner*—Stephen E. Jones
(74) *Attorney, Agent, or Firm*—RatnerPrestia

(57) ABSTRACT

In an exemplary embodiment of the present invention, a probe for sampling electromagnetic energy in a circuit is provided. The probe includes a mating portion for mating, in a broadside configuration, with an electromagnetic energy transmission media in the circuit. The probe also includes a correction device for correcting impedance mismatch resulting from mating the mating portion with the electromagnetic energy transmission media of the circuit.

13 Claims, 11 Drawing Sheets

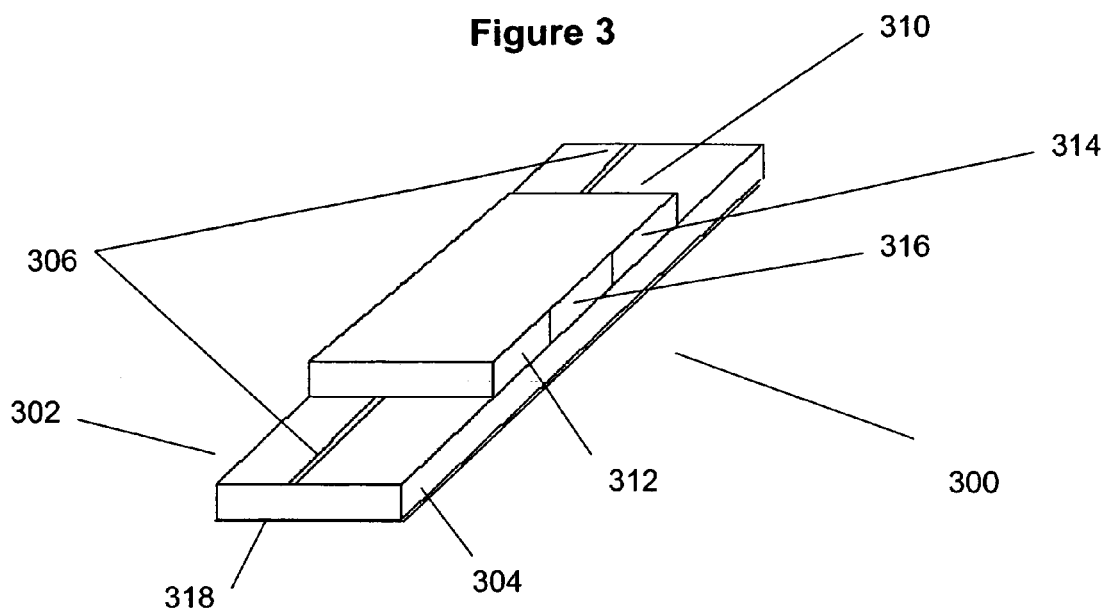

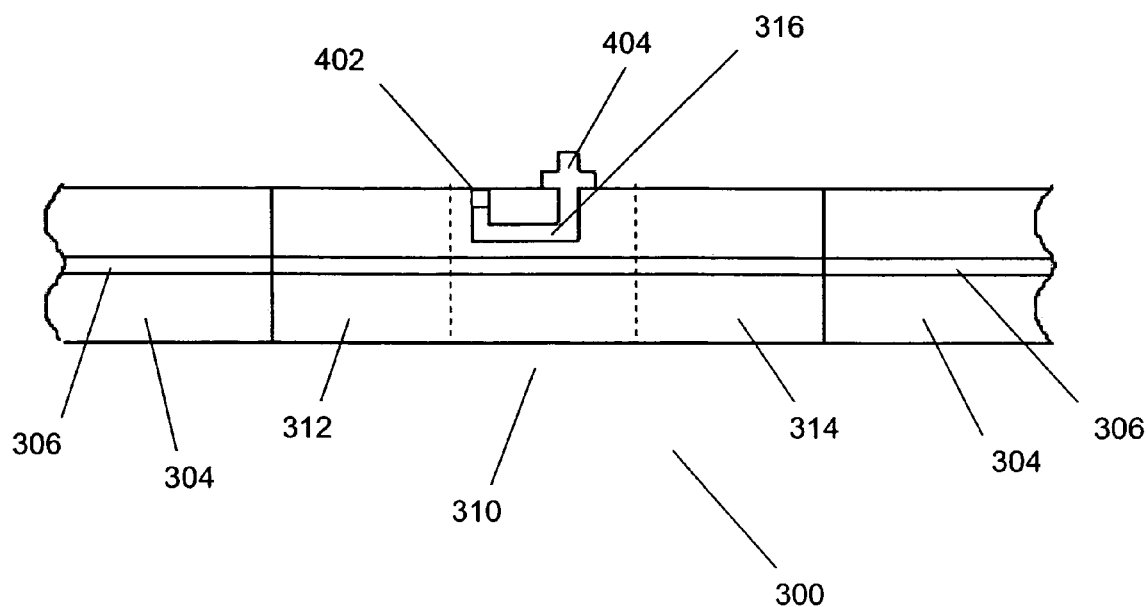

ELECTROMAGNETIC BROADSIDE ENERGY PROBE WITH INTEGRAL IMPEDANCE MATCHING

CROSS REFERENCE TO RELATED APPLICATIONS

This application is a divisional of U.S. application Ser. No. 10/320,986 filed Dec. 17, 2002 now U.S. Pat. No. 6,956,448.

FIELD OF THE INVENTION

The present invention relates, in general, to sampling electromagnetic energy in a circuit, and more specifically, to a probe useful for sampling microwave energy in a microwave circuit without disturbing the circuit function.

BACKGROUND OF THE INVENTION

Direct current, low frequency, and digital circuits are often tested using a high impedance voltage probe or a low impedance current probe; however, such testing probes cannot be used to test all electromagnetic energy circuits. For example, microwave circuits are not typically tested in this fashion.

Microwave test equipment typically measures power. In order to test a microwave circuit, each microwave component is typically presented with a matched load and source. When knowledge of intercircuit performance is desired in a complex microwave circuit, test ports may be designed into the circuit. Alternatively, the microwave circuit may be tested a partial assembly.

When test ports are designed into the circuit, valuable circuit real estate is used. Further, the determination of the critical circuit junction to place an observation point is often difficult.

When a fault exists in a circuit, it may be desirable to disassemble the circuit into subassemblies in order to locate the fault; however, through the disassembly of the circuit (or the re-assembly), the fault could get lost (or even never located). This is particularly problematic in the case of testing space hardware, where if the fault is lost during troubleshooting (including disassembly) the circuit may be deemed not worthy for flight.

As such, it would be desirable to develop an apparatus and method for testing microwave and other high frequency circuits in an impedance matched and reliable manner that overcomes the above-mentioned deficiencies.

SUMMARY OF THE INVENTION

In an exemplary embodiment of the present invention, a probe for sampling electromagnetic energy in a circuit is provided. The probe includes a mating portion for mating with an electromagnetic energy transmission media in the circuit, in a broadside configuration. The probe also includes a correction device for correcting impedance mismatch resulting from mating the mating portion with the electromagnetic energy transmission media of the circuit.

In another exemplary embodiment of the present invention, a electromagnetic energy sampling circuit is provided. The electromagnetic energy sampling circuit includes an electromagnetic energy transmission media for carrying electromagnetic energy. The electromagnetic energy sampling circuit also includes a probe for sampling the electromagnetic energy in the electromagnetic energy transmission media. The probe includes a mating portion for mating broadside with the electromagnetic energy transmission media in a broadside configuration. The probe also includes a correction device for correcting impedance mismatch resulting from mating the mating portion with the electromagnetic energy transmission media.

In yet another exemplary embodiment of the present invention, a method of sampling a signal in a circuit is provided. The method includes mating a probe with an electromagnetic energy transmission media in the circuit, the mating being configured in a broadside configuration. The method also includes correcting impedance mismatch in the circuit resulting from the mating of the probe with the electromagnetic energy transmission media. The method also includes sampling a portion of the signal in the circuit.

In yet another exemplary embodiment of the present invention, a method of joining a first subassembly circuit with a second subassembly circuit is provided. The method includes mating a probe with an electromagnetic energy transmission media in the first subassembly circuit, the mating being configured in a broadside configuration. The method also includes correcting impedance mismatch in the first subassembly circuit resulting from the mating of the probe with the electromagnetic energy transmission media. The method also includes sampling a portion of the signal in the circuit using the probe. Additionally, the method includes transmitting the sampled portion of the signal to the second subassembly circuit.

BRIEF DESCRIPTION OF THE DRAWINGS

The invention is best understood from the following detailed description when read in connection with the accompanying drawings. This emphasizes that according to common practice, the various features of the drawings are not drawn to scale. On the contrary, the dimensions of the various features are arbitrarily expanded or reduced for clarity. Included in the drawings are the following features:

FIG. 3 is a perspective view of an edge coupled implementation of a stripline coupler in accordance with an exemplary embodiment of the present invention;

FIG. 4 is a top view of a portion of an edge coupled implementation of a stripline coupler in accordance with an exemplary embodiment of the present invention;

DETAILED DESCRIPTION OF THE INVENTION

Figure 1A:
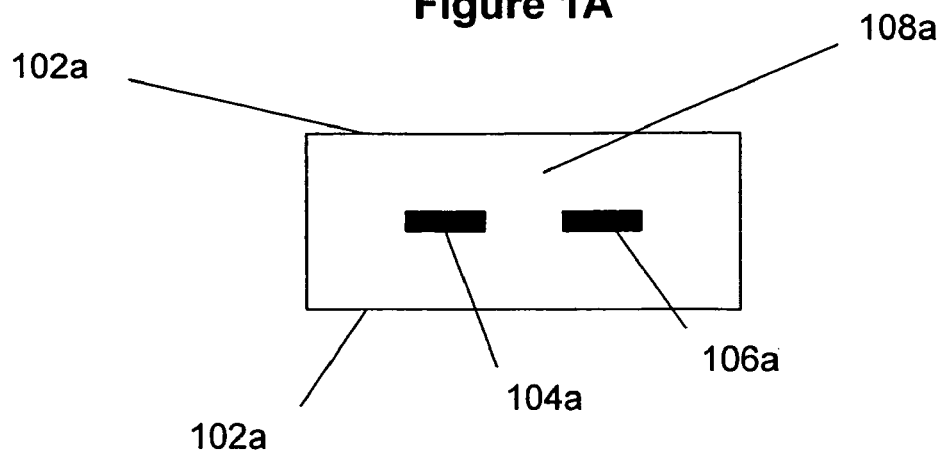
FIG. 1A is a cross sectional view of an electromagnetic energy transmission media and a coupling conductor arranged in a coplanar configuration in accordance with an exemplary embodiment of the present invention.

This invention provides for the sampling of electromagnetic energy signals (e.g., microwave signals) in circuits (e.g., microstrip transmission line circuits) without disturbing the functionality of the circuit. In an exemplary embodiment, the present invention can use any portion of the circuit to be tested that includes a microstrip line that is three quarters of a wavelength (3λ/4) in length. The microstrip line of the circuit to be tested, combined with the mating portion of a probe, forms a stripline coupler. For example, the stripline coupler can be designed to couple off as little as −20 dB of signal to as much as −3 dB of signal. In an exemplary embodiment of the present invention, the stripline coupler provides a 50 Ω source to a microwave component following it and a 50 Ω load to a microwave component preceding it. By maintaining an impedance common to the probe and the circuit components accurate measurements can be made without changing the functionality of the circuit to be tested.

In an exemplary embodiment, the present invention uses a probe (including a quarter wavelength microstrip line and substrate) to form a stripline coupler by overlaying the probe on a microstrip line included in the circuit under test. Stripline couplers are well understood devices with much literature and theory developed for their design. By overlaying two 50 ohm microstrip lines (the microstrip in the circuit to be tested and the microstrip in the probe), the resultant stripline coupler has an impedance that is less than 50 ohms. For example, the additional dielectric and ground plane on top of the stripline coupler increases the capacitance in the circuit, thereby lowering the apparent impedance. Additionally, the extra conductor needed to form the stripline coupler also tends to lower the impedance. To mitigate this impedance mismatch, an impedance transformer can be built into the dielectric included in the overlay. Quarter wave (λ/4) transformers may be used in the overlay where the impedance of the line is set using the following equation:

$$Z=(Z_0 * Z_C)^{0.5}$$

Where
$Z$=Transformer line impedance
$Z_0$=desired impedance
$Z_c$=impedance of coupler Since the transformer impedance is between the stripline coupler impedance and the circuit impedance, the dielectric of the overlay can be used to implement the transformer. For example, a microstrip line (in the circuit to be tested) and an overlay (including a portion of microstrip line) can be used to form a stripline coupler. The overlay sandwiches the two-microstrip lines that together form the stripline coupler. A connector or microstrip, stripline, or other type of microwave transmission media may be attached to the coupled line in order to extract the coupled signal from the circuit.

The two adjacent conductors (i.e., the microstrip line of the circuit to be tested and the microstrip of the overlay) may be arranged in any of a number of configurations so long as a sample of the signal in the circuit to be tested can be extracted and transmitted to the microstrip line of the overlay. Any electromagnetic media in the circuit to be tested that allows for the transmission of a portion of the signal in the media, to the overlay, can be sampled in this manner.

The sampling occurs internal to the circuit as a diagnostic or design tool. Alternatively, the sampling may be employed to join two circuits (or two subassembly circuits) together as part of a manufacturing process.

The sampling occurs by mating a probe or other connector with the circuit to be tested, thereby changing the open microstrip (or other electromagnetic energy transmission media) transmission line structure (in the circuit to be tested) into a stripline structure.

When a microstrip (in the circuit to be tested) is covered by an overlay (including an additional dielectric and ground plane) the resulting stripline coupler has a lower characteristic impedance than before the microstrip was covered by the overlay. Further, the addition of another conductor (e.g., a microstrip in the overlay) that provides the sampling adds additional capacitance to the circuit to be tested and therefore lowers the characteristic impedance ($Z_0$) of the circuit. In such an embodiment, the relationship between $Z_0$ and the capacitance can be illustrated by the following equation:

$$Z_0=(L/C)^{0.5}$$

In an exemplary embodiment of the present invention, a quarter wavelength transmission line structure is used to transform the characteristic impedance such that the effects of the impedance mismatch are mitigated.

Figure 1B:
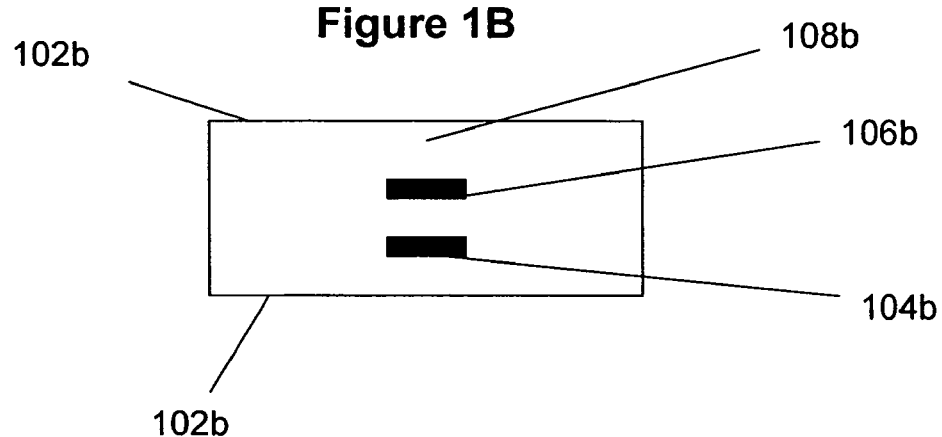
FIG. 1B is a cross sectional view of an electromagnetic energy transmission media and a coupling conductor in a broadside configuration in accordance with an exemplary embodiment of the present invention.
Figure 1C:
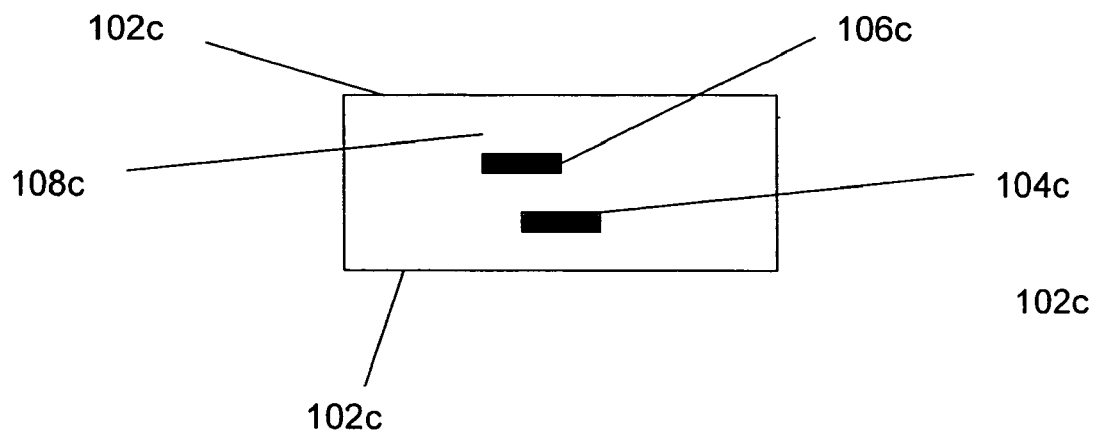
FIG. 1C is a cross sectional view of an electromagnetic energy transmission media and a coupling conductor in an offset broadside configuration in accordance with an exemplary embodiment of the present invention.

FIGS. 1A through 1C illustrate various exemplary configurations of an electromagnetic energy transmission media 104 (e.g., a microstrip in the circuit to be tested) with a coupling conductor 106 (e.g., a microstrip included in a sampling probe). The three configurations illustrated in FIGS. 1A through 1C are examples, and any configuration that provides for the sampling of electromagnetic energy from an electromagnetic energy transmission media of a circuit to be tested is within the scope of the present invention.

For example, FIG. 1A illustrates an electromagnetic energy transmission media 104a and a coupling conductor 106a in a coplanar or an edge coupled configuration. For example, the electromagnetic energy transmission media 104a may be a microstrip in a microwave circuit. It may be desirable to sample the electromagnetic energy in microstrip 104a. As such, a probe (including coupling conductor 106a) is positioned (i.e., mated) such that coupling conductor 106a aligns with the microstrip 104a, as shown in FIG. 1A. Coupling conductor 106a is configured such that a sample of the electromagnetic energy in microstrip 104a is sampled by coupling conductor 106a. FIG. 1A also illustrates a ground plane 102A above and below coupling conductor 106a and microstrip 104a. Dielectric material 108a is included between microstrip 104a, coupling conductor 106a, and ground plane 102a.

FIG. 1B illustrates electromagnetic energy transmission media 104b and coupling conductor 106b in a broadside configuration. As with FIG. 1A, electromagnetic energy transmission media 104b may be a microstrip in a microwave circuit. To sample the electromagnetic energy in microstrip 104b, coupling conductor 106b (included in a probe or overlay) is positioned as shown in FIG. 1B. Ground plane 102b is positioned above and below microstrip 104b and coupling conductor 106b. As with FIG. 1A, dielectric material 108b is positioned between ground plane 102b, microstrip 104b, and coupling conductor 106b.

FIG. 1C is similar to FIGS. 1A and 1B except that coupling conductor 106c and electromagnetic energy transmission media 104c are arranged in an offset broadside configuration, as opposed to the standard broadside configuration illustrated in FIG. 1B, and the coplanar configuration illustrated in FIG. 1C.

Figure 2A:
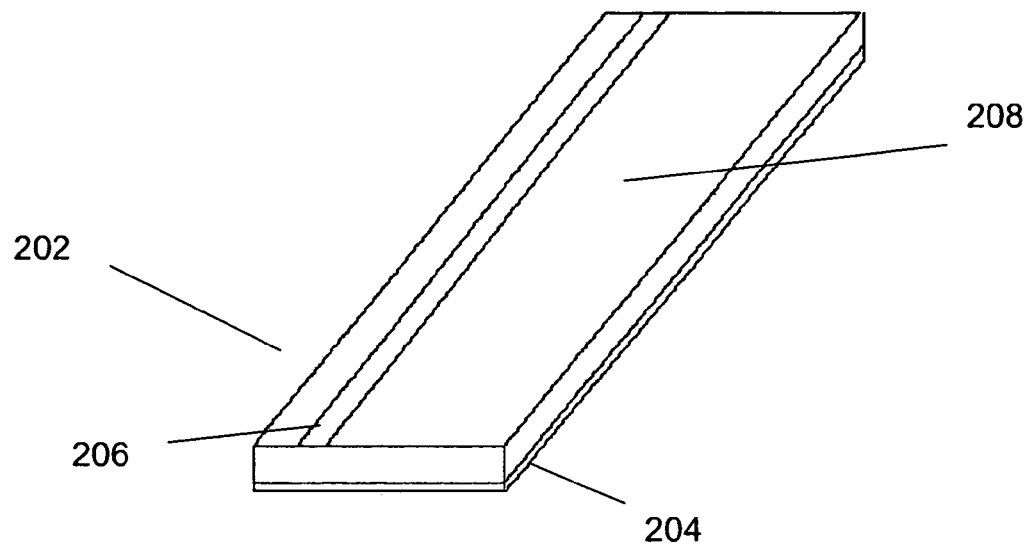
FIG. 2A is a perspective view of an electromagnetic energy transmission media for use in accordance with an exemplary embodiment of the present invention.

FIG. 2A is a perspective view of an electromagnetic energy transmission media 202. For example, electromagnetic energy transmission media 202 may be a microstrip. Microstrip 202 includes ground plane conductor 204 positioned below substrate 208. Microstrip line 206 is formed on substrate 208. Microstrip 202 is a component of a circuit to be tested, for example, a microwave circuit. In order to take a sample of the electromagnetic energy in the microwave circuit, it is desirable to provide a noninvasive apparatus for sampling the electromagnetic energy in the microwave circuit while not interfering with the operation of the microwave circuit.

Figure 2B:
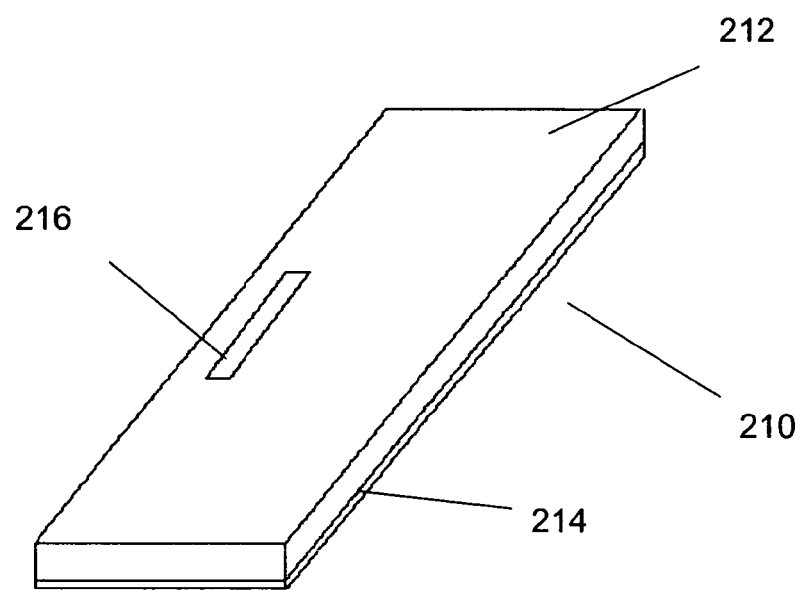
FIG. 2B is a perspective view of an overlay for use in accordance with an exemplary embodiment of the present invention.

FIG. 2B illustrates overlay 210 (a probe) that can be mated with microstrip 202. Overlay 210 includes ground plane conductor 214 beneath substrate 212. Coupling section 216 includes a conductor (such as a microstrip) that is used to take a sample of the electromagnetic energy in microstrip line 206.

Figure 2C:
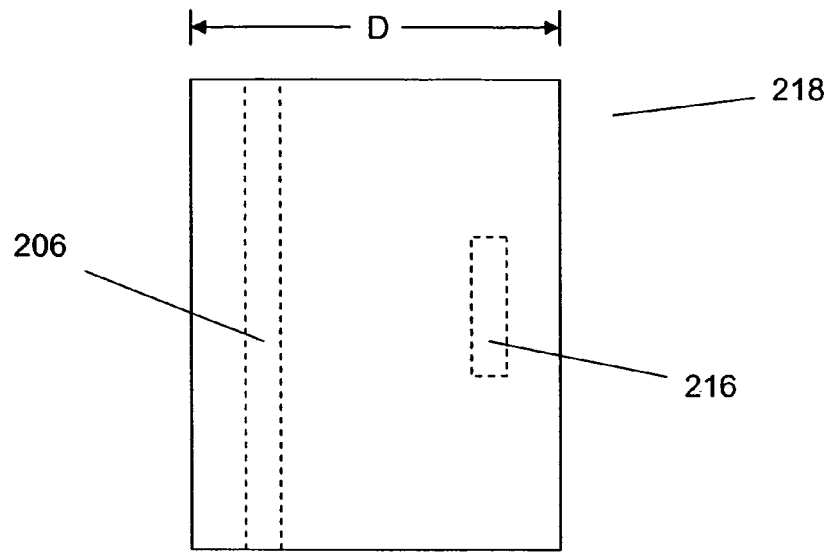
FIG. 2C is a top view of a stripline coupler in accordance with an exemplary embodiment of the present invention.

FIG. 2C is a top view of a stripline coupler 218. Stripline coupler 218 includes overlay 210 mated with electromagnetic energy transmission media 202. FIG. 2C also illustrates an exemplary position of microstrip line 206 with respect to coupling section 216. The distance D between microstrip line 206 and coupling section 216 controls the amount of electromagnetic energy (e.g., microwave energy) to be coupled off of (sampled) microstrip line 206.

Figure 2D:
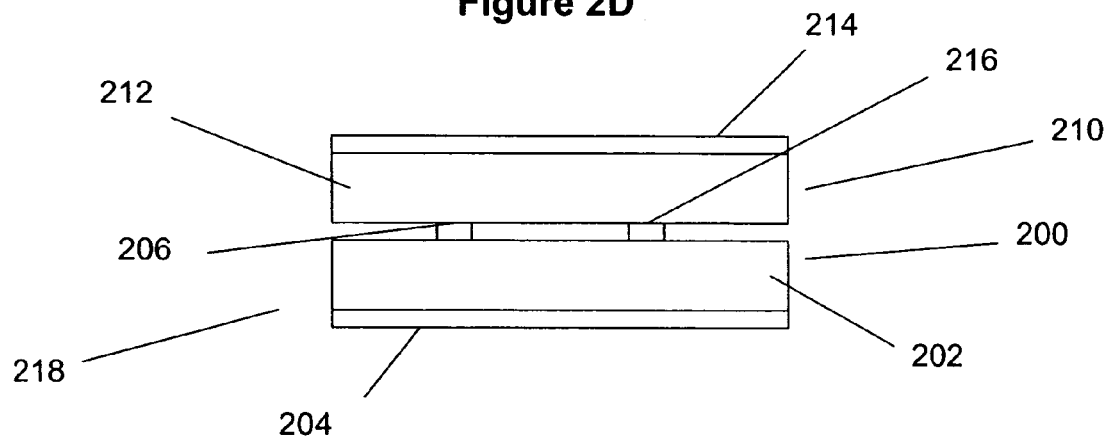
FIG. 2D is a cross sectional view of a stripline coupler in accordance with an exemplary embodiment of the present invention.

FIG. 2D is a cross sectional view of stripline coupler 218. Stripline coupler 218 includes overlay 210 mated with electromagnetic energy transmission media 202. Ground plane conductor 214 is positioned above substrate 212, and ground plane conductor 204 is positioned below substrate 208. As shown in FIG. 2D, coupling section 216 and microstrip line 206 are arranged in a coplanar (also known as edge coupled) configuration.

In the exemplary embodiment of the present invention illustrated in FIGS. 2A through 2D, overlay 210 includes a smaller portion of microstrip line (coupling section 216) than in microstrip 202 (microstrip line 206). Overlay 210 sandwiches microstrip line 206 and coupling section 216, thereby forming stripline coupler 218. In an exemplary embodiment of the present invention, overlay 210 on microstrip line 206 covers about the same length of microstrip as the coupler is long on both the input and output. A connector (not shown) with its signal conductor attached to the coupled line and its ground conductor attached to the top of the ground plane of overlay 210 can be used to extract the coupled signal.

FIG. 3 is a perspective view of an edge coupled stripline coupler 300. Stripline coupler 300 includes electromagnetic energy transmission media 302 (e.g., a microstrip) and overlay (probe) 310. Microstrip 302 is part of an existing circuit to be tested, for example, a microwave circuit. Overlay 310 is mated with microstrip 302 such that overlay 310 can obtain a sample of the electromagnetic energy in the microwave circuit.

Microstrip 302 includes a ground plane 318 positioned beneath dielectric substrate 304. Microstrip 302 also includes microstrip line 306. Overlay 310 may include a ground plane (not shown) positioned above dielectric overlay 312, coupled conductor 316, and a dielectric overlay 314. Coupled conductor 316 (also known as a coupled section or sampling section) is used to sample electromagnetic energy from the microwave circuit.

By mating overlay 310 with microstrip 302 the impedance of microstrip 302 (as seen by the original circuit) would tend to change. For example, the additional dielectric and possible ground plane (included in overlay 310) on top of microstrip 302 increases the capacitance, and thereby lowers the characteristic impedance as seen by the original circuit. Additionally, coupling conductor 316 (provided by overlay 310) also tends to lower the characteristic impedance. As such, by mating overlay 310 with microstrip 302 the characteristic impedance as seen by the microwave circuit would be changed. In order to mitigate this impedance mismatch, an impedance transformer may be built in to overlay 310. This impedance transformer is provided by dielectric overlay 312 and dielectric overlay 314.

FIG. 4 is a top view of the edge coupled stripline coupler 300 shown in FIG. 3. As in FIG. 3, dielectric substrate 304, and overlay 310 (including dielectric overlay 312, coupled conductor 316, and dielectric overlay 314) are also illustrated in FIG. 4. Coupled conductor 316 includes a connector 404. Connector 404 may be used to provide a transmission point for the sampled signal from coupled conductor 316 to another circuit, for example a testing or analysis circuit. In an alternative embodiment, the microwave circuit (including stripline coupler 300) may be a subassembly circuit (part of a larger circuit) that is to be connected to another subassembly circuit. Coupled conductor 316 may also include a resistor 402 to provide a termination for the coupler.

Figure 5:
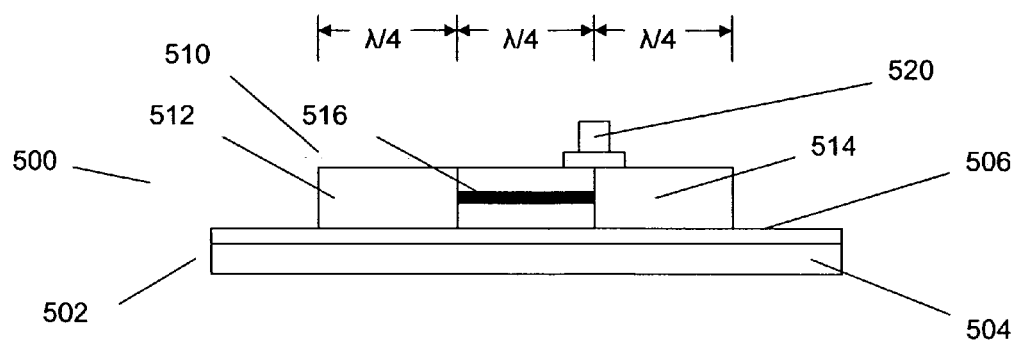
FIG. 5 is a side view of a broadside stripline coupler in accordance with an exemplary embodiment of the present invention.

FIG. 5 is an illustration of a side view of a broadside coupler 500. Broadside coupler 500 includes electromagnetic energy transmission media 502 and overlay 510. Electromagnetic energy transmission media 502 (e.g., microstrip) includes dielectric substrate 504 and microstrip conductor 506. Microstrip 502 may also include a ground plane conductor (not shown in FIG. 5). Overlay 510 includes dielectric overlay 512, a ground plane conductor (not shown in FIG. 5), stripline coupling conductor 516, and dielectric overlay 514. A connector 504 is also included for sending the sampled signal to a desired location (e.g., testing or analysis equipment, another subassembly circuit, etc.). As illustrated in the exemplary embodiment shown in FIG. 5, dielectric overlay 512, stripline coupling conductor 516, and dielectric overlay 514 are each a quarter wavelength long.

By mating overlay 510 with microstrip 502, the characteristic impedance as seen by the microwave circuit would tend to change, as described above; however, dielectric overlay 512 and dielectric overlay 514 are included as an impedance transformer to mitigate the impedance mismatch. As such, the microwave circuit does not see any appreciable impedance mismatch as a result of the mating of overlay 510 with microstrip 502.

Connector 520 could be located in any of a number of places so long as it provides a connection point between stripline coupling conductor 516 and an external point (e.g., testing or analysis equipment, a connection to another transmission line if the invention is used to join two circuits as part of a manufacturing process, etc.).

To illustrate the impedance mismatch correction operation, consider stripline coupler 500 again in FIG. 5. For example, we assume that microstrip 502 has a thickness of approximately 10 mils, and dielectric overlay 512 and dielectric overlay 514 have a thickness of approximately 20 mils. We also assume that stripline coupling conductor 516 is a quarter wavelength in length. We then assume that microstrip 502 had a characteristic impedance of 50 Ohms before it was covered by overlay 510. Without the impedance mismatch correction, mating overlay 510 with microstrip 502 would result in the characteristic impedance, as seen by the external circuit, to change from 50 Ohms to approximately 35.6 Ohms.

In order to correct this impedance mismatch, an impedance transformer can be used. In order to calculate the impedance of the impedance transformer, the following relation may be used:

$$Z_t = (Z_0 Z_L)^{0.5}, \text{ where}$$

$Z_t$ = the impedance of the impedance transformer;
$Z_0$ = the impedance of the microstrip before the overlay is mated; and
$Z_L$ = the resultant impedance after the overlay is mated.

In the assumptions listed above, $Z_0$=50 Ohms and $Z_L$=35.6 Ohms. As such, $Z_t$ can be calculated to be 42 Ohms. In order to design a transformer impedance of 42 Ohms, dielectric overlay 512 and dielectric overlay 514 (each including a dielectric medium and a ground plane, and each having a length of one-quarter wavelength) can be produced having a dielectric constant $\in_r$=7. As such, the characteristic impedance, as viewed from the external circuit, is approximately 50 Ohms. The external circuit is unaware of any disturbance in its impedance.

Although the impedance Zt can be calculated as shown above, in some situations it may be difficult to find a material to be used as dielectric overlay 512 or dielectric overlay 514, that is, a material having an appropriate dielectric constant to mitigate the effects of a potential impedance mismatch. As such, FIGS. 6 and 7 illustrate two methods of changing the impedance of an available overlay such that any potential impedance mismatch is properly corrected.

Figure 6:
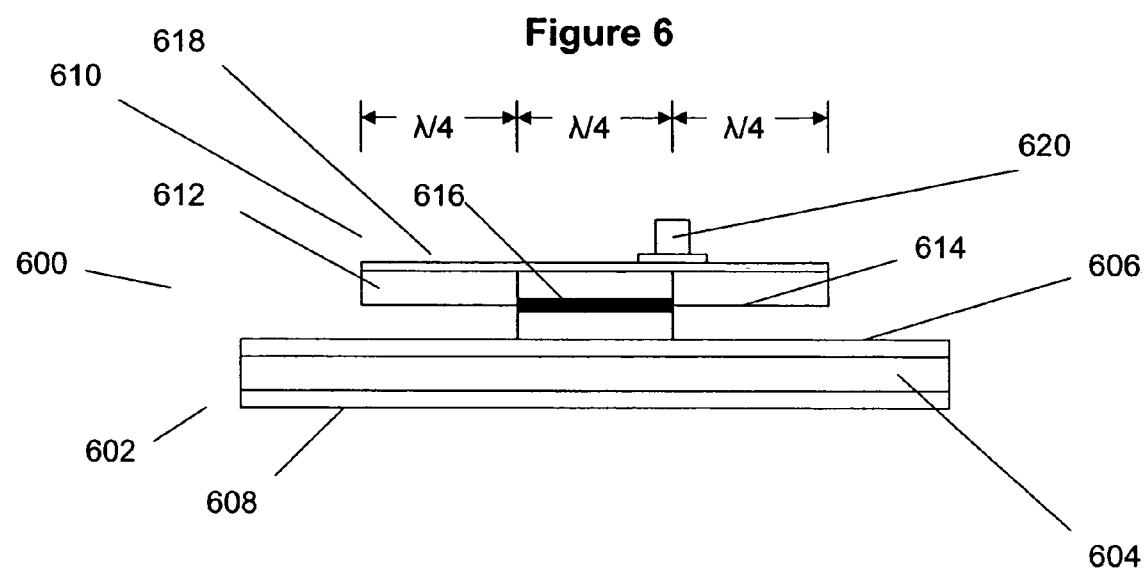
FIG. 6 is a side view of another broadside stripline coupler in accordance with an exemplary embodiment of the present invention.

FIG. 6 illustrates stripline coupler 600 including microstrip 602 and overlay 610. Microstrip 602 includes ground plane 608, dielectric substrate 603, and microstrip conductor 606. Overlay 610 includes dielectric overlay 612, ground plane 618, stripline coupling conductor 616, and dielectric overlay 614. Overlay 610 is mated with microstrip 602 such that stripline coupling conductor 616 can extract a sample of the microwave energy in microstrip conductor 606. Overlay 610 also includes a connector 604 for sending the sample of the microwave signal to a desired location. FIG. 6 is different from FIG. 5 in that the dielectric overlay 612 and the dielectric overlay 614 have been reduced in size (e.g., cut in size) in a horizontal plane to an appropriate level such that the characteristic impedance, as viewed by the microwave circuit, appears to not have been changed by the mating of the overlay 610 with the microstrip 602.

Figure 7:
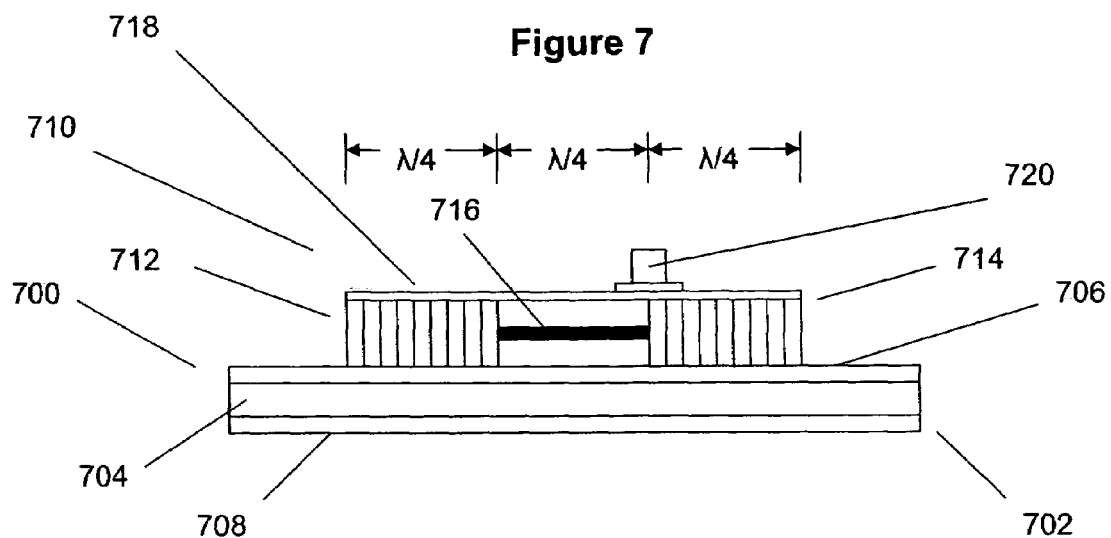
FIG. 7 is a side view of yet another broadside stripline coupler in accordance with an exemplary embodiment of the present invention.

FIG. 7 illustrates stripline coupler 700 including microstrip 702 and overlay 710. Microstrip 702 is part of a microwave circuit. Microstrip 702 includes ground plane 708, dielectric substrate 704, and microstrip conductor 706. Overlay 710 is mated with microstrip 702. Overlay 710 includes dielectric overlay 712, ground plane 718, stripline coupling conductor 716, and dielectric overlay 714. Stripline coupling conductor 716 is used to extract a sample of the microwave energy from microstrip conductor 706. Overlay 710 includes connector 704 for sending the sample of the microwave signal to a desired location.

Stripline coupler 700 is different from the coupler 600 illustrated in FIG. 6 in that material has been removed from dielectric overlay 712 and dielectric overlay 714 in a vertical plane, as opposed to material being removed from dielectric overlay 612 and dielectric over 614 in a horizontal plane.

Figure 8:
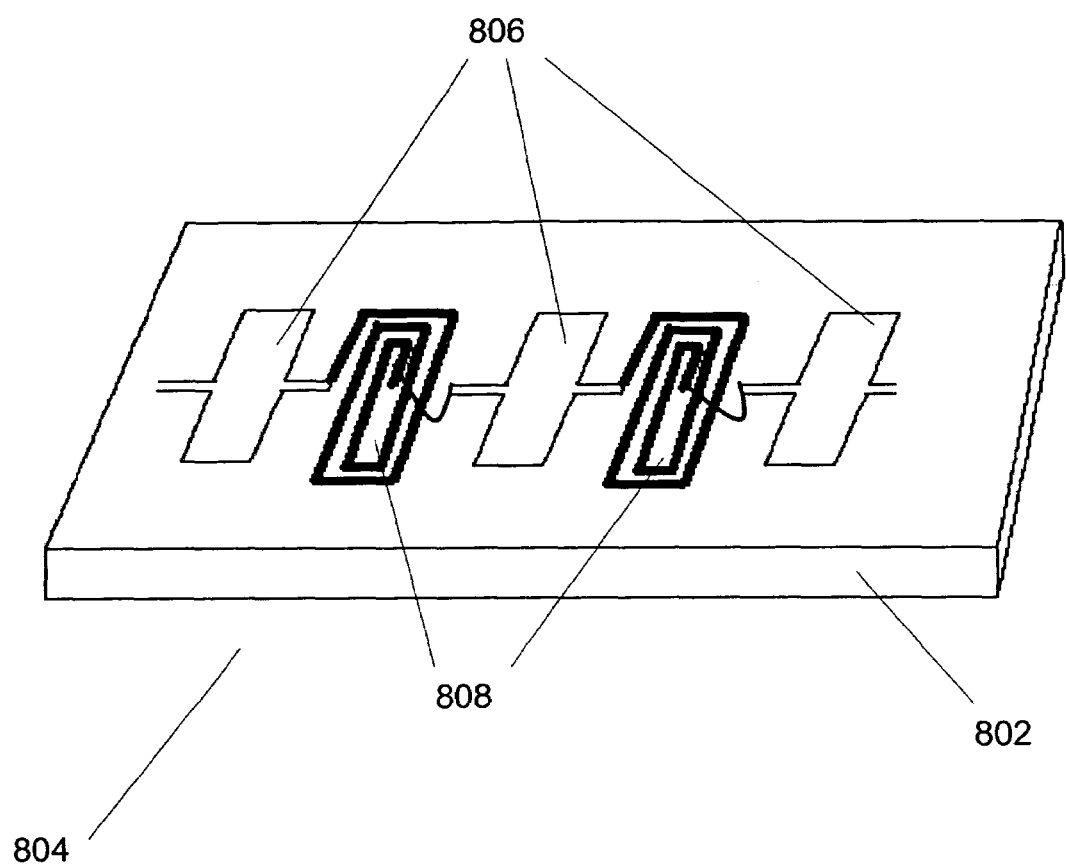
FIG. 8 is a perspective view of a printed overlay in accordance with an exemplary embodiment of the present invention.

In some situations physical space may not exist for a three-quarter wavelength transmission line. In such a situation an artificial transmission line may be used to sample an electromagnetic energy signal. FIG. 8 illustrates overlay 804 including a dielectric support 802 and an artificial transmission line that includes capacitors 806 and inductors 808. Capacitors 806 and inductors 808 are printed on to dielectric support 802. Inductors 808 can be used to sample the signal and a dielectric overlay can again be used to adjust the impedance as needed. For example, this overlay would be used on a circuit with similar topology using an artificial transmission line rather than a simple microstrip line.

In this case printed inductors and capacitors could be used as preexisting sampling points in designs that do not have room for a three-quarter wavelength transmission line. In this case, the coupling, while still electromagnetic, would be "transformer" coupled.

Figure 9:
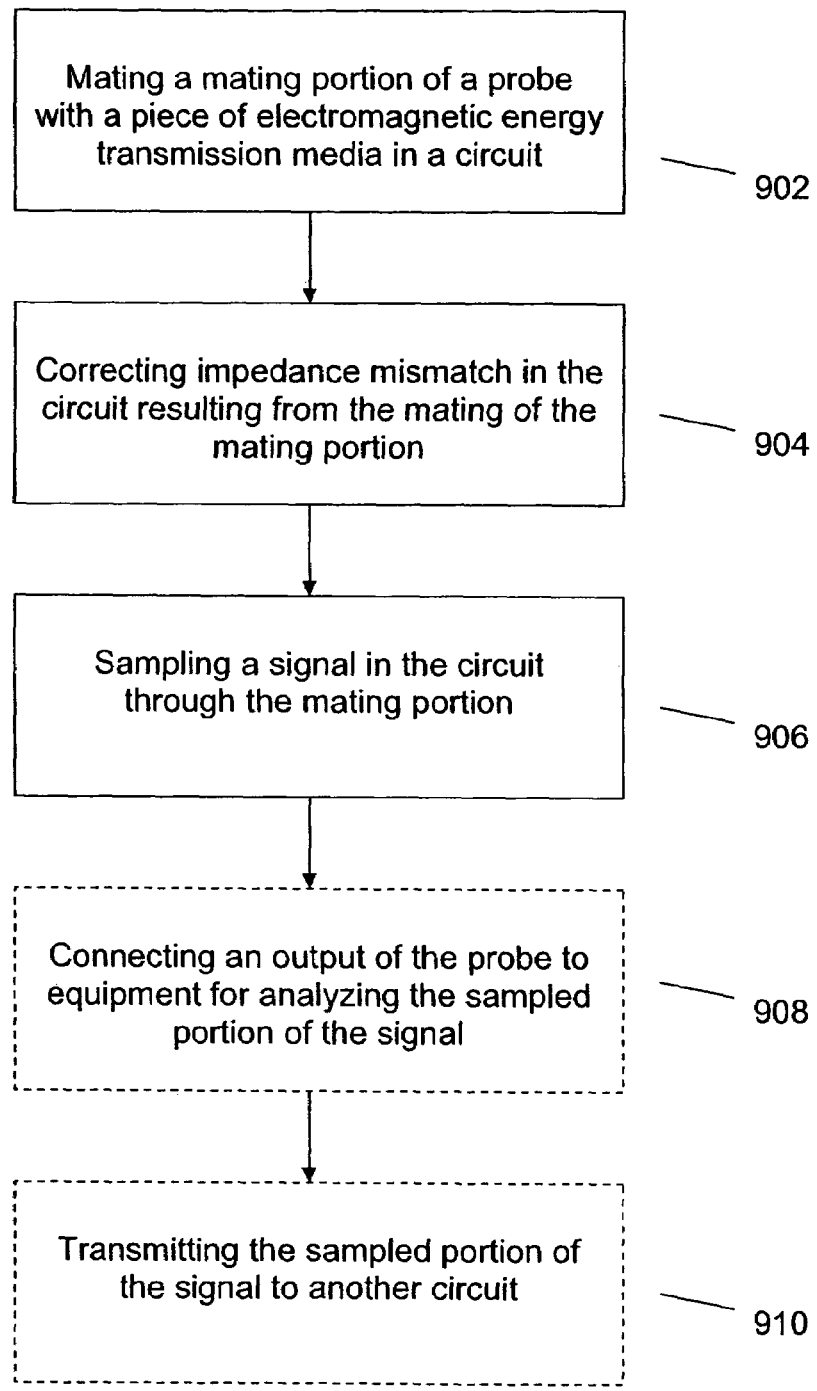
FIG. 9 is a flow diagram illustrating a method of sampling a signal in an electromagnetic energy circuit in accordance with an exemplary embodiment of the present invention.

FIG. 9 is a flow diagram illustrating a method of sampling a signal in a circuit. At step 902, a mating portion of a probe (overlay) is mated with a piece of electromagnetic energy transmission media (e.g., a microstrip) in a circuit. The mating of the mating portion may include clamping the probe to the piece of electromagnetic energy transmission media. At step 904 impedance mismatch in the circuit that results from the mating of the mating portion with the piece of electromagnetic energy transmission media is corrected. At step 906 a signal in the circuit is sampled through the mating portion. The present exemplary method includes two optional steps, 908 and 910. At optional step 908, the probe is attached (e.g., connected by a wire such as a coaxial cable) to a piece of equipment for analyzing the sampled portion of the signal. As optional step 910, the sampled portion of the circuit (e.g., a subassembly circuit) is transmitted to another circuit, for example, another subassembly circuit. By transmitting the sampled signal to the another subassembly circuit, the two subassembly circuits are thereby connected to one another, for example, as part of a manufacturing or joining process.

Figure 10:
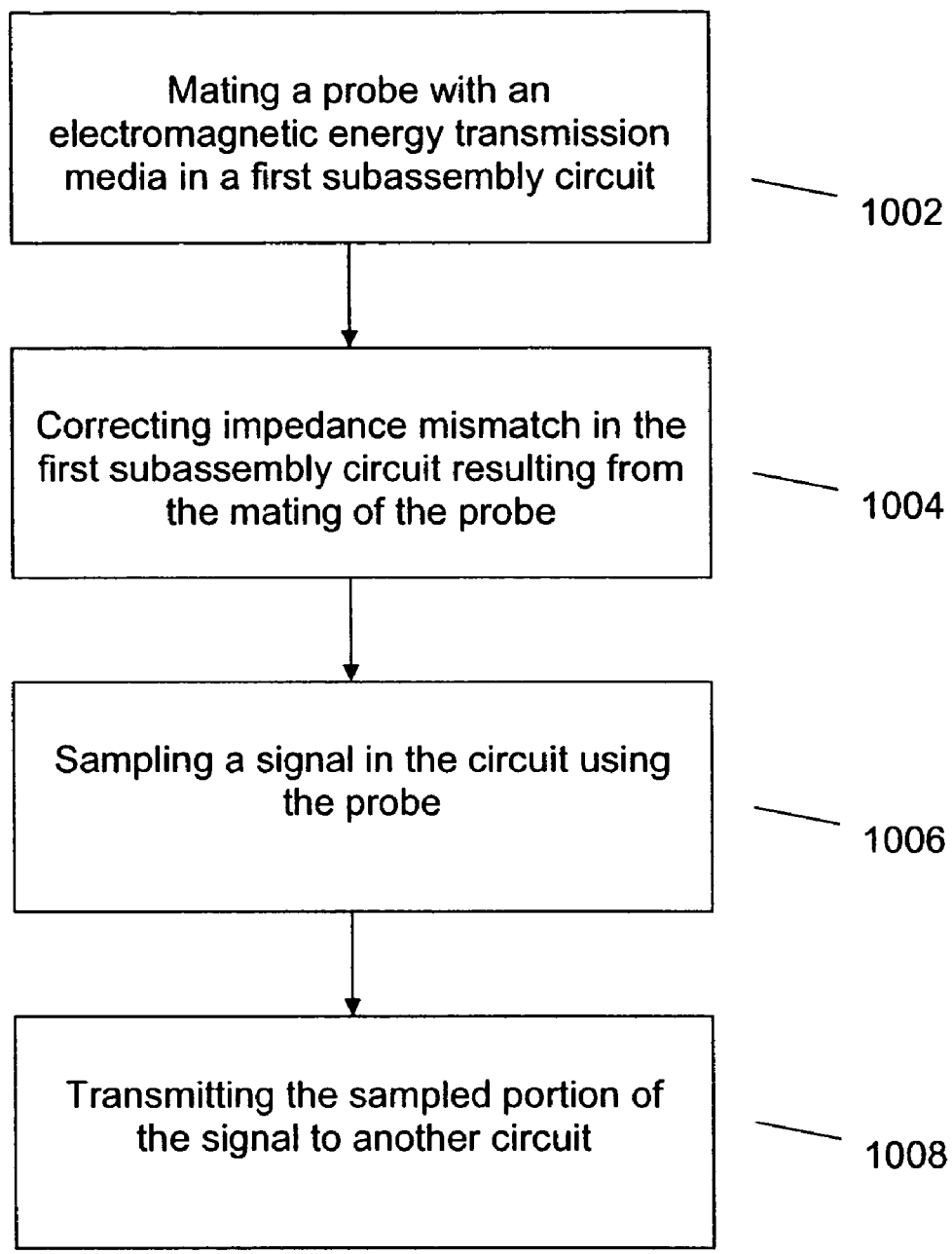
FIG. 10 is a flow diagram illustrating a method of joining a first subassembly circuit with a second subassembly circuit in accordance with an exemplary embodiment of the present invention.

FIG. 10 is a flow diagram illustrating a method of joining a first subassembly circuit with a second subassembly circuit. At step 1002, a probe (overlay) is mated with an electromagnetic energy transmission media (e.g., a microstrip) in the first subassembly circuit. At step 1004 impedance mismatch in the first subassembly circuit that results from the mating of the probe with the electromagnetic energy transmission media is corrected. At step 1006 a signal in the circuit is sampled using the probe. At step 1008, the sampled portion of the signal from the first subassembly circuit is transmitted to a second subassembly circuit. By transmitting the sampled signal to the second subassembly circuit, the two subassembly circuits are thereby connected to one another, for example, as part of a manufacturing or joining process.

Although the present invention has been described primarily in terms of microwave circuits, it is not limited thereto. The sampling probe and the method of sampling a circuit may be applied to various types of electromagnetic energy circuits, for example, radio frequency (RF) circuits.

Although the electromagnetic energy transmission media has been primarily described as a microstrip, it is not limited thereto. The electromagnetic energy transmission media may be any type of media from which a sample of electromagnetic energy may be obtained using the probe described herein.

Although the present invention has primarily been described in relation to a probe or an overlay, these terms generically refer to devices that may be connected, coupled, or aligned with an electromagnetic energy transmission media (e.g., a microstrip transmission line) and thereby extract a sample of the electromagnetic energy from the electromagnetic energy transmission media. In the case where the electromagnetic energy transmission media is a microstrip transmission line, the probe or overlay may be defined as a device that upon being mated with the microstrip transmission line results in the microstrip transmission line being changed to a stripline structure.

Although illustrated and described herein with reference to certain specific embodiments, the present invention is nevertheless not intended to be limited to the detailed shown. Rather, various modifications may be made in the details within the scope and arranges of equivalence of the claims and without departing from the spirit of the invention.

What is claimed is:

1. A probe for sampling electromagnetic energy in a circuit comprising:
   a mating portion for mating broadside with an electromagnetic energy transmission media in the circuit, the mating portion including a coupling conductor for retrieving a sample of the electromagnetic energy in the electromagnetic energy transmission media; and
   a correction device for correcting impedance mismatch resulting from mating the mating portion with the electromagnetic energy transmission media of the circuit,
   wherein the coupling conductor is a quarter wavelength conductor, and the correction device includes a first quarter wavelength dielectric overlay positioned on a first side of the coupling conductor, and a second quarter wavelength dielectric overlay on a second side of the coupling conductor, the combination of the coupling conductor, the first quarter wavelength dielectric overlay, and the second quarter wavelength dielectric overlay forming a three quarter wavelength overlay that overlays the electromagnetic energy transmission media as a broadside coupler when the mating portion is mated with the electromagnetic energy transmission media.

2. An electromagnetic energy sampling circuit comprising:
   an electromagnetic energy transmission media for carrying electromagnetic energy; and
   a probe configured as a broadside coupler with respect to the electromagnetic energy transmission media for sampling the electromagnetic energy in the electromagnetic energy transmission media, said probe including a mating portion for temporarily mating with and sampling energy from the electromagnetic energy transmission media, said probe also including a correction device for correcting impedance mismatch in the electromagnetic energy transmission media resulting from mating the mating portion with the electromagnetic energy transmission media,
   wherein the mating portion is a quarter wavelength conductor, and the correction device includes a first quarter wavelength dielectric overlay positioned on a first side of the mating portion and a second quarter wavelength dielectric overlay positioned on a second side of the mating portion.

3. The electromagnetic energy sampling circuit of claim 2 wherein the mating portion, the first quarter wavelength dielectric overlay, and the second quarter wavelength dielectric overlay form a three quarter wavelength overlay that overlays the electromagnetic energy transmission media when the mating portion is mated with the electromagnetic energy transmission media.

4. The electromagnetic energy sampling circuit of claim 2 wherein the correction device is configured to transform an impedance resulting from mating the mating portion with the electromagnetic transmission media to another impedance substantially similar to a characteristic impedance of the electromagnetic transmission media.

5. A probe for sampling electromagnetic energy in a circuit comprising:
   a mating portion for temporarily mating with and sampling energy from an electromagnetic energy transmission media in the circuit; and
   a correction device for correcting impedance mismatch in the electromagnetic energy transmission media resulting from mating the mating portion with the electromagnetic energy transmission media of the circuit,
   wherein the mating portion includes a coupling conductor for retrieving a sample of the electromagnetic energy in the electromagnetic energy transmission media, and
   the coupling conductor is configured as a broadside coupler with respect to the electromagnetic energy transmission media,
   wherein the coupling conductor is a quarter wavelength conductor, and the correction device includes a first quarter wavelength dielectric overlay positioned on a first side of the coupling conductor, and a second quarter wavelength dielectric overlay on a second side of the coupling conductor, the combination of the coupling conductor, the first quarter wavelength dielectric overlay, and the second quarter wavelength dielectric overlay forming a three quarter wavelength overlay that overlays the electromagnetic energy transmission media as a broadside coupler when the mating portion is mated with the electromagnetic energy transmission media.

6. The probe of claim 5, wherein the coupling conductor is configured as an offset broadside coupler with respect to the electromagnetic energy transmission media.

7. The probe of claim 5 wherein the probe includes a plurality of printed inductors for sampling electromagnetic energy in the circuit when the mating portion is mated with the electromagnetic energy transmission media.

8. The probe of claim 5 wherein the probe is configured to sample electromagnetic energy in a microwave circuit, a radio frequency circuit, or a millimeter wave circuit.

9. The probe of claim 5 wherein the electromagnetic energy transmission media is a microstrip, coplanar waveguide, or slot line.

10. The probe of claim 5, wherein the temporary mating of the mating portion with the electromagnetic energy transmission media increases a capacitance of the circuit, thereby decreasing an impedance of the circuit, the correction device substantially negating the increase in the capacitance such that the impedance of the circuit is substantially unchanged as compared to an impedance of the circuit prior to the temporary mating of the mating portion with the electromagnetic energy transmission media.

11. A probe for sampling electromagnetic energy in a circuit comprising:
   a mating portion for mating with an electromagnetic energy transmission media in the circuit; and
   a correction device for correcting impedance mismatch resulting from mating the mating portion with the electromagnetic energy transmission media of the circuit;
   wherein the mating portion is configured to sample a substantial amount of electromagnetic energy in the circuit, and
   the remaining amount of electromagnetic energy in the circuit is free-of any disturbance,
   wherein the mating portion is coupled broadside to the transmission media in the circuit,
   the mating portion includes a coupling conductor for retrieving a sample of the electromagnetic energy in the electromagnetic energy transmission media, and
   the coupling conductor is a quarter wavelength conductor, and the correction device includes a first quarter wavelength dielectric overlay positioned on a first side of the coupling conductor, and a second quarter wavelength dielectric overlay on a second side of the coupling conductor, the combination of the coupling conductor, the first quarter wavelength dielectric overlay, and the second quarter wavelength dielectric overlay forming a three quarter wavelength overlay that overlays the electromagnetic energy transmission media when the mating portion is mated with the electromagnetic energy transmission media.

12. The probe of claim 11 wherein the mating portion is configured to sample up to 50 percent of the electromagnetic energy in the circuit, without disturbing the remaining amount of electromagnetic energy in the circuit.

13. The probe of claim 11 wherein the correction device is configured to have the following impedance:

$$Z=(Z_o * Z_c)^{0.5}$$

where $Z$=impedance of the probe
$Z_o$=impedance of the transmission media of the circuit
$Z_c$=impedance of the correction device.

* * * * *